United States Patent [19]
Kamiya et al.

[11] Patent Number: 5,111,686
[45] Date of Patent: May 12, 1992

[54] FAULT DIAGNOSIS APPARATUS FOR MOUNTING ON A VEHICLE

[75] Inventors: Kenji Kamiya, Anjo; Hiroyuki Ina, Kariya; Akimasa Nakamura, Obu; Masakazu Honda, Chiryu, all of Japan

[73] Assignee: Nippondenso Co., Ltd., Kariya, Japan

[21] Appl. No.: 656,963

[22] Filed: Feb. 19, 1991

[30] Foreign Application Priority Data

Feb. 26, 1990 [JP] Japan .................................. 2-045273

[51] Int. Cl.⁵ ............................................. G01M 15/00
[52] U.S. Cl. ..................................... 73/117.3; 340/438
[58] Field of Search ........................... 73/117.3, 118.1; 364/424.03, 424.04; 340/438

[56] References Cited
U.S. PATENT DOCUMENTS
5,003,476 3/1991 Abe ................................. 73/117.3 X FOREIGN PATENT DOCUMENTS
61-255411 11/1986 Japan .
63-88423 4/1988 Japan .

Primary Examiner—Jerry W. Myracle
Attorney, Agent, or Firm—Cushman, Darby & Cushman

[57] ABSTRACT

A diagnosis apparatus adapted to be mounted on a vehicle, which stores conditions of abnormality of an electronic control apparatus for controlling the vehice and diagnoses a fault in the apparatus, comprising operating condition detecting element for detecting the condition of the vehicle operation, abnormal condition memory element storing an occurrence of an abnormal condition of the vehicle, vehicle operating condition memory element for storing the operating conditions when an abnormal condition occurs in the vehicle, reproduction mode instruction element for instructing to execute abnormal condition reproduction test mode, operating condition comparison element for comparing the current vehicle operating conditions with the vehicle operating conditions at the time of abnormality occurrence in the abnormal condition reproduction mode set by the instruction element, and notifying element for notifying a result of the above-mentioned comparison of vehicle operating conditions.

8 Claims, 9 Drawing Sheets

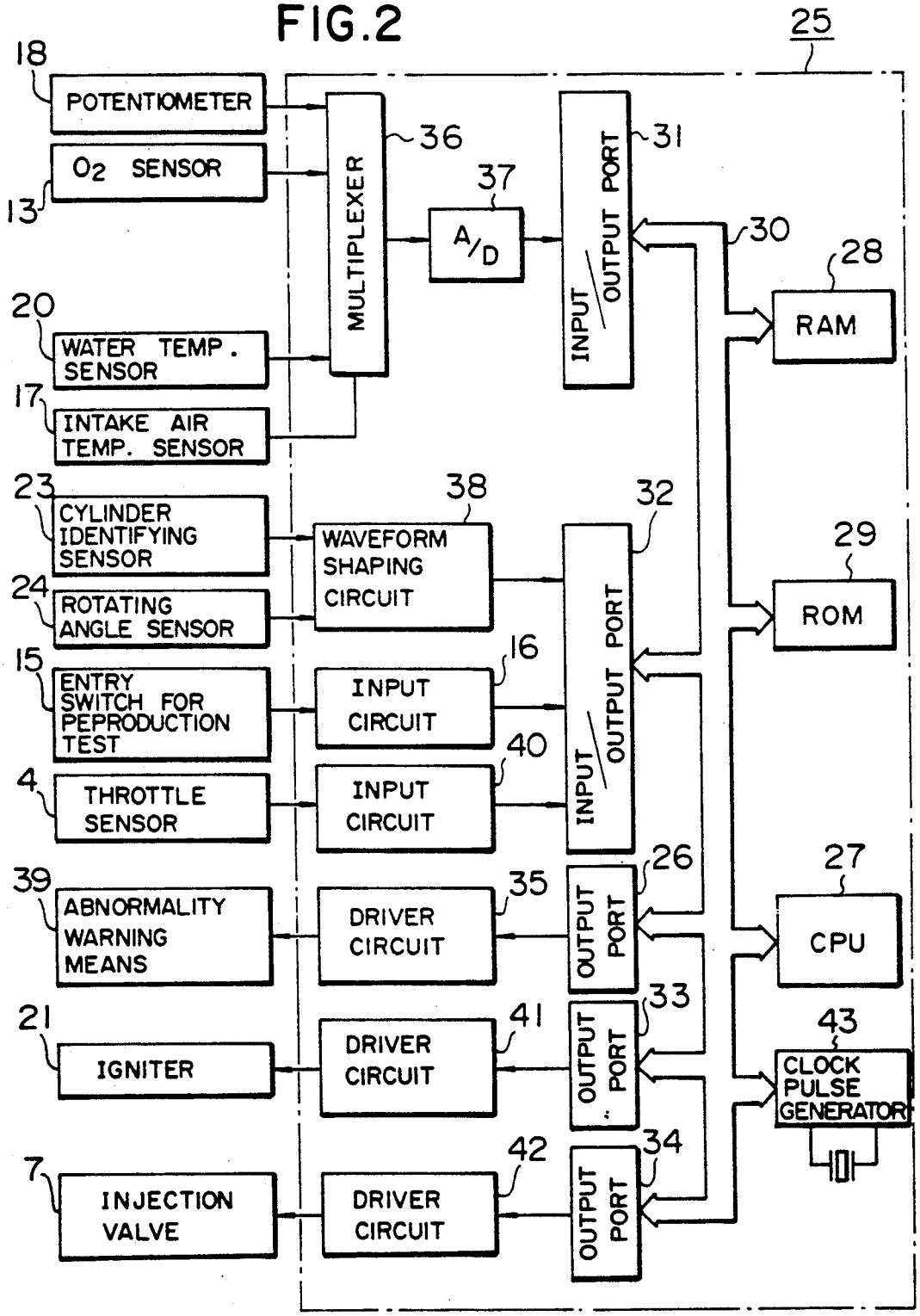

A FAULT OCCURRED

FAULT DIAGNOSIS APPARATUS FOR MOUNTING ON A VEHICLE

BACKGROUND OF THE INVENTION

1. Field of the Invention

This invention relates to a fault diagnosis apparatus for mounting on a vehicle, which stores conditions of abnormality of an electronic control apparatus to control a vehicle and diagnoses the fault.

2. Description of the Related Arts

There have been developed techniques which provide means for storing not only time of occurrence of abnormality and signals representing abnormalities but also the operating condition before and after the abnormality occurrence of an electronic control system or sensors of the electronic control system, and supply information on the abnormality to put the information to good use in repairs in a repair shop, for example (e.g. JP-A-61-255411 and JP-A-63-88423).

Even with the prior-art techniques mentioned above, however, when a test is conducted by reproducing the operating condition of the vehicle when abnormality occurred, it is necessary to make the operating conditions of some items same as those recorded at the time of abnormality occurrence. For this purpose, the driver is required to have the skill to make the operating conditions of the items under test identical with those at the time of actual abnormality occurrence. In addition, it is not easy to know whether or not those operating conditions of the vehicle have actually been reproduced, which difficulty has been a problem.

SUMMARY OF THE INVENTION

An object of this invention is to provide a fault diagnosis apparatus for mounting on a vehicle, which apparatus makes it easy to confirm whether or not the above-mentioned operating conditions at the time of abnormality occurrence in an electronic control system on a vehicle have been reproduced.

Therefore, as shown in FIG. 11, this invention provides a fault diagnosis apparatus, comprising:

operating condition detecting means for detecting the operating conditions of a vehicle;

abnormal condition memory means for storing an occurrence of an abnormal condition of the vehicle;

vehicle operating condition memory means for storing the operating conditions when an abnormal condition occurs in the vehicle;

reproduction mode instruction means for instructing to execute an abnormal condition reproduction test mode;

operating condition comparison means for comparing the current vehicle operating conditions with the vehicle operating conditions at the time of abnormality occurrence in the abnormal condition reproduction mode set by the instruction means; and notifying means for notifying a result of the above-mentioned comparison of vehicle operating conditions.

Preferably, the comparison means may include means for activating the notifying means when a difference between the vehicle operating conditions at the time of abnormality occurrence and the current vehicle operating conditions is less than a predetermined value.

In addition, the comparison means may include means for outputting to the notifying means an output according to a difference between the vehicle operating conditions at the time of abnormality occurrence and the current vehicle operating conditions.

Furthermore, the above-mentioned vehicle operating condition memory means may store the operating conditions before and after the occurrence of an abnormal condition of the vehicle as well as those at the occurrence of the abnormality, and the above-mentioned reproduction test mode instruction means may include selection and comparison means for selectively providing the comparison means with the operating conditions at the time of, before and after the abnormality occurrence as comparison input.

Thus, the operating conditions of the vehicle are detected by the operating condition detecting means, an occurrence of abnormality in the vehicle is stored in the abnormal condition memory means, and also, the operating conditions at the time of occurrence of the abnormal condition of the vehicle are stored in the vehicle operating condition memory means. When an abnormal condition reproduction test mode is conducted by the reproduction mode instruction means, the current vehicle operating conditions are compared with the vehicle operating conditions when the abnormal condition occurred by the operating condition comparison means, and results of comparison of vehicle operating conditions are notified by the notifying means.

BRIEF DESCRIPTION OF THE DRAWINGS

FIG. 2 is a block diagram showing in detailed form a composition of the control unit of the apparatus in FIG. 1;

DESCRIPTION OF THE PREFERRED EMBODIMENTS

Figure 1:
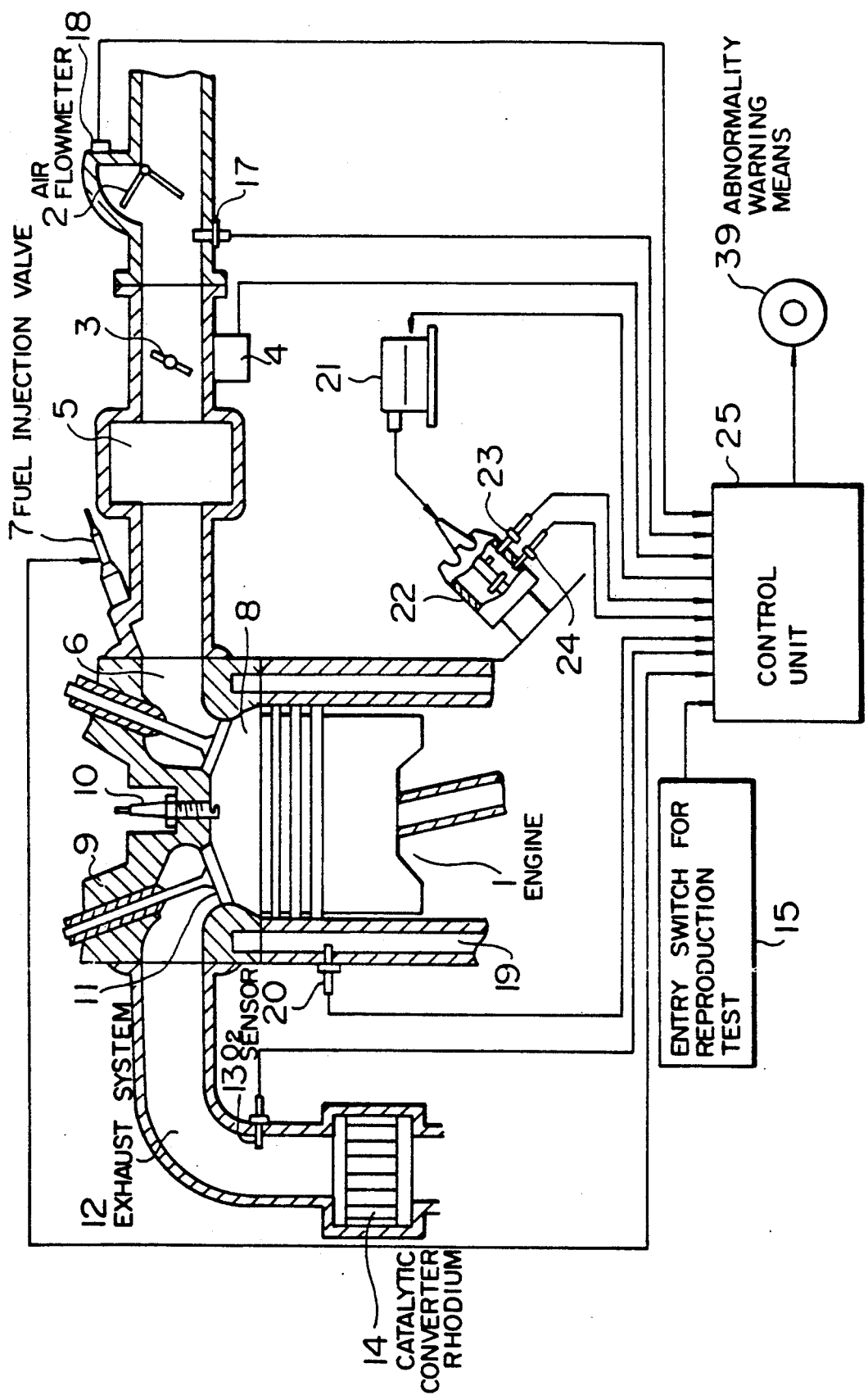
FIG. 1 is a construction diagram with a partially sectional view showing an embodiment of the apparatus according to this invention.

FIG. 1 shows a schematic construction of an internal combustion engine mounted on a vehicle in which an air-fuel ratio control system is installed. Mounted in the inlet system of the engine 1 are an air flowmeter 2 with a potentiometer 18, a throttle valve 3, a throttle sensor 4 for detecting the opening of the throttle valve, and an intake air temperature sensor 17. The air drawn in through the inlet system is passed through a surge tank 5, fed into an intake manifold 6, mixed with a fuel injected through a fuel injection valve 7, which operates in response to electric pulse signals, and the mixture of a specified air-fuel ratio is supplied into a combustion chamber 8 of the engine 1.

In the combustion chamber 8, the fuel/air mixture is ignited by an ignition plug 10 mounted to a cylinder head, and the combustion gas is passed through an exhaust valve 11, and sent to an exhaust system 12.

In the exhaust system 12, there is provided an oxygen analyzer ($O_2$ sensor), which utilizes a solid-electrolyte, e.g., $ZrO_2$ and generates a voltage signal according to the residual oxygen concentration in the exhaust gas. From output signal from the $O_2$ sensor 13, the air-fuel ratio is determined.

In a cylinder block 19 of the engine 1, a water temperature sensor 20 for detecting the cooling water temperature is mounted. A distributor 22, which distributes ignition signals from an igniter 21 to the cylinders, has a cylinder identifying sensor 23 and a rotating angle sensor 24 built therein. Detection signals from the elements for detecting the operating condition of the engine 1, which include the air flow-meter 2, the $O_2$ sensor 13, the water temperature sensor 20, the cylinder identifying sensor 23 and the rotating angle sensor 24, are transmitted to a control unit 25. This control unit 25 is formed by a microcomputer, for example, and its composition is as shown in FIG. 2. To be more specific, the control unit 25 is provided with a random access memory (hereinafter referred to as "RAM") 28 to serve as a temporary memory for a central processing unit (hereinafter referred to as "CPU") 27 during its execution of arithmetic operations and a read only memory (hereinafter referred to as "ROM") 29 used as a program memory. The CPU 27, RAM 28 and ROM 29 are connected by a data bus 30. The data bus 30 is connected to input/output ports 31, 32 and output ports 26, 33, 34. The input/output port 31 is connected through the multiplexer 36 with the potentiometer 18, the $O_2$ sensor 13, the intake air temperature sensor 17, and the water temperature sensor 20. Signals sent from those elements are converted by an A/D converter 37 into digital signals and reach the input/output port 31. Signals from the cylinder identifying sensor 23 and the rotating angle sensor 24 are shaped by a waveform shaping circuit 38 and provided to the input/output port 32. In addition, a detection signal from the throttle sensor 4 is converted by an input circuit 40 into digital form and sent to the input/output port 32. Output signals from the output ports 26, 33, 34 are passed through driver circuits 35, 41, 42 and sent to the igniter 21, the fuel injection valve 7, and an abnormality warning means 39, which serves as notification means, for ignition control, injection quantity control and notification control, respectively. A clock pulse generator 43 gives timing clock signals to the CPU 27, etc.

The abnormality warning means 39 uses a buzzer, a lamp or the like to notify the occurrence of abnormality in the vehicle to the driver, and also perform a function to notify to an operator in a repair shop whether values of operating conditions in the reproduction test at the shop coincide with those at the fault occurrence. The switch 15 for reproduction test entry as the reproduction test mode instruction means is a switch to select whether or not to set a mode to indicate that the operating conditions at the time of fault and in a reproduction test substantially coincide with each other, which reproduction test will be described later. Output from the switch 15 is transmitted through the input circuit 16 to the input/output port 32.

The operation of the fault diagnosis apparatus constructed as mentioned above will be described in the following. The operations of the apparatus are divided into the operation while the vehicle is running and the operation in a reproduction test.

While the vehicle is running, a decision is made at fixed time intervals whether or not a fault has occurred, and when a fault did not occur in a certain time interval, the oldest piece of stored data in the operating condition memory in the RAM 28 is erased and the latest operating conditions are written in that memory area. This operation is repeated. Incidentally, the memory is of course arranged such that the stored data is preserved even after the power supply switch (key switch) of the vehicle is turned off. And, from the time when a fault occurred, the storing operations are repeated for a fixed time period and thereafter, a storing operation is not performed, but the final data is preserved.

In a reproduction test, the operating conditions of several items under test are compared with the stored operating conditions when a fault occurred, and when all criteria are fulfilled, this is notified to the driver by turning the lamp flickering.

Figure 3A:
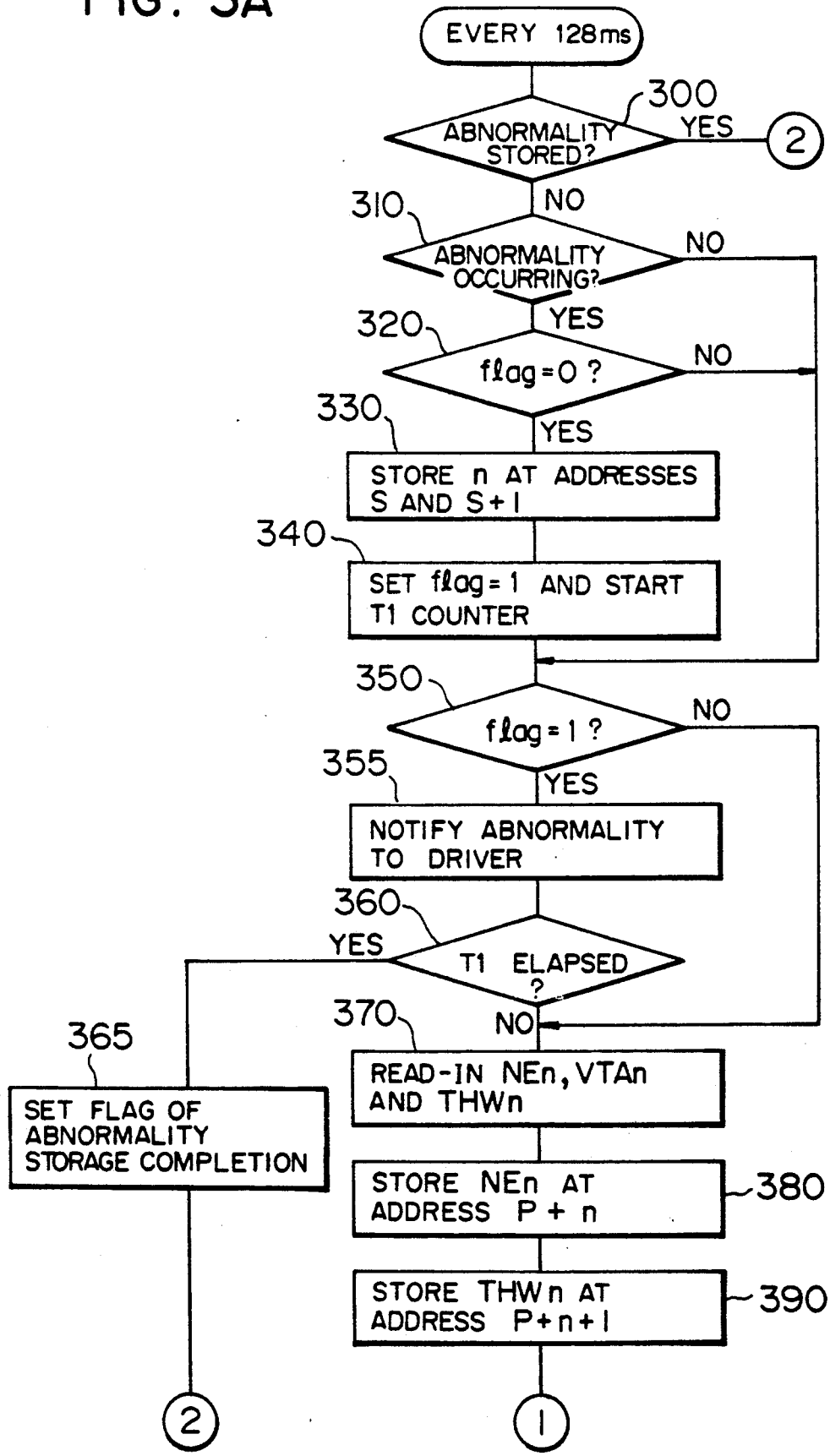
FIGS. 3A and 3B are flowcharts for explaining the operation of the apparatus of FIG. 1.
Figure 3B:
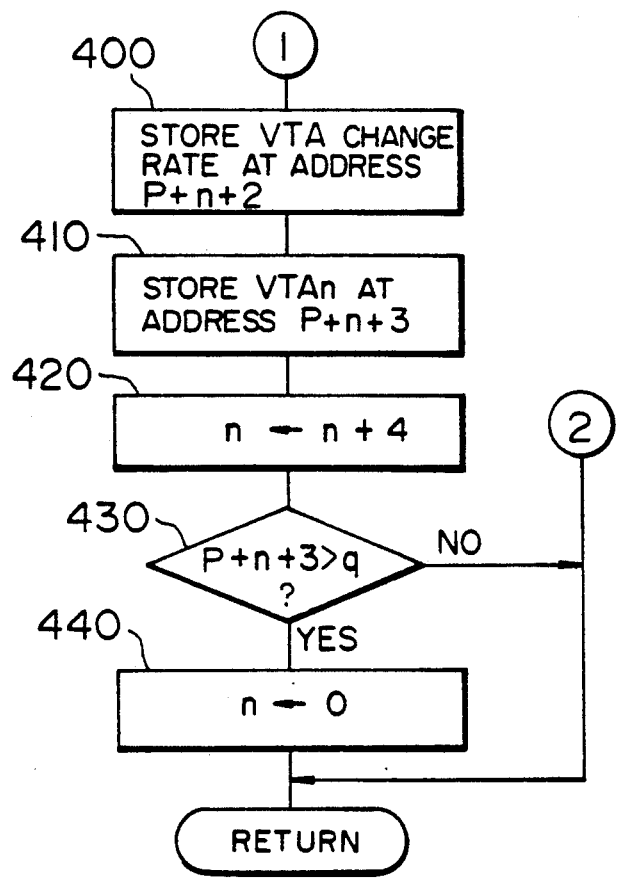

With reference to FIGS. 3A and 3B, description will be made of the operation of the diagnosis apparatus while the vehicle is running. The diagnosis apparatus keeps recorded therein the number of revolutions of the engine, throttle opening, and water temperature repeatedly for the past fixed period of time. When abnormality occurs, the apparatus issues a warning, and after continuing recording operations until time T1 elapses, holds the recorded data. FIGS. 3A and 3B shows routines executed every 128 ms by the CPU 27, which routines are connected by connectors 1 and 2. To begin with, at the step 300, a check is made whether or not an abnormal operating condition has been stored. If the storage has been done, it is not necessary to store any more, control is returned to a calling routine. If the storage has not been done, the process proceeds to the a fault to be stored is occurring. If not, the process goes on to the step 350. Incidentally, the abnormality check at the step 310 is made according to the state of storage of the result of abnormality diagnosis about the elements such as the control unit 25 and its sensors, which diagnosis is performed by a routine different from the routines of FIGS. 3A and 3B. Diagnosis items include abnormality that the output of the water temperature sensor 20 changes rapidly at a speed higher than a permitted speed, abnormality that the output amplitude of the $O_2$ sensor 13 drops lower than a predetermined value, and abnormality of being immovable of the air-fuel ratio feedback value based on output of the $O_2$ sensor 13. As the abnormality diagnosis memory routines for the above-mentioned elements, well-known routines can be used with no change made to them, which are in widespread use in vehicle engine control systems using a microcomputer.

If abnormality is detected at the step 310, the process proceeds to the step 320. At the step 320, a decision is made whether the flag indicating the occurrence of abnormality is 0. If the flag is 1, the process moves on to the step 350. If the flag is 0, this means that abnormality occurred for the first time at this stage of operation. So, the process moves on to the step 330, and an address value n where data at the time of abnormality occurrence is to be stored is stored at addresses S and S + 1 (2 bytes are required to specify an address). Then, the process proceeds to the step 340, and the flag is set to 1 and the counter is made to start counting. At the next step 350, a decision is made whether the flag is 1. If the flag is 0, the process advances to the step 370. If the flag is 1, the process goes on to the step 355 where the abnormality warning means or lamp 39 notifies the occurrence of abnormality to the driver. At the next step 360, a decision is made whether or not the count of the counter is larger than a predetermined value. If a predetermined time T1 (5 sec. for example) has elapsed since the flag was set to 1, it is not necessary to store data any more, and the process proceeds to the step 365 where a flag is set for indicating the completion of storage of an abnormal condition, and control is returned to a calling routine. If the flag is 1 and time T1 has not elapsed, the operating conditions after abnormality occurred are being stored, and the process moves on to the step 370. By the way, it ought to be noted that setting longer time T1 results in data stored after a fault occupying a larger proportion of the stored data, and that setting shorter time T1 results in data stored before a fault occupying a larger proportion of the stored data. At the step 370, the current number of revolutions of the engine ($NE_n$), throttle opening ($VTA_n$), and water temperature ($THW_n$) are read in.

At the subsequent steps 380 and 390, $NE_n$ is stored in an address $P + n$, and $THW_n$ is stored in an address $P + n + 1$.

At the next step 400, a change rate of $VTA = (VTA_n - VTA_{n-1})/T$ is calculated from the value $VTA_{n-1}$ in the previous execution of the routine (128 ms before) and the value $VTA_n$ which was read in the current execution of the routine, and stored in an address $P + n + 2$.

At the next step 410, $VTA_n$ is stored in an address $P + n + 3$. Then, at the step 420, the address is increased to $n = n + 4$ for next storage. At the step 430, a decision is made whether not $P + n + 3 > q$. If $P + n + 3 > q$, the capacity for operating condition storage will be exceeded in the next storage, and the process proceeds to the step 440 to return to the start address by setting $n = 0$. If $P + n + 3 \leqq q$, control is returned to a calling routine.

Figure 4:
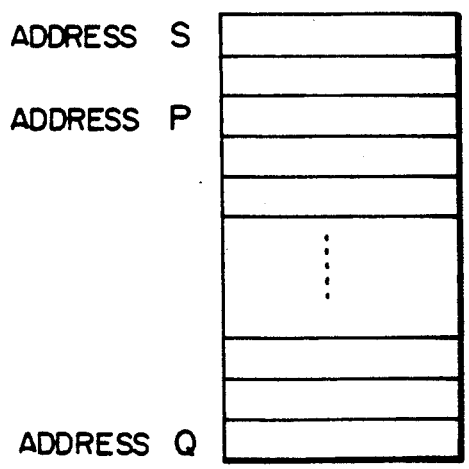
FIG. 4 is a diagram showing a memory area in the RAM used in the execution of routines of FIGS. 3A and 3B.

FIG. 4 shows a memory area in the RAM which is used for storage in the execution of the routines of FIGS. 3A and 3B.

Figure 5:
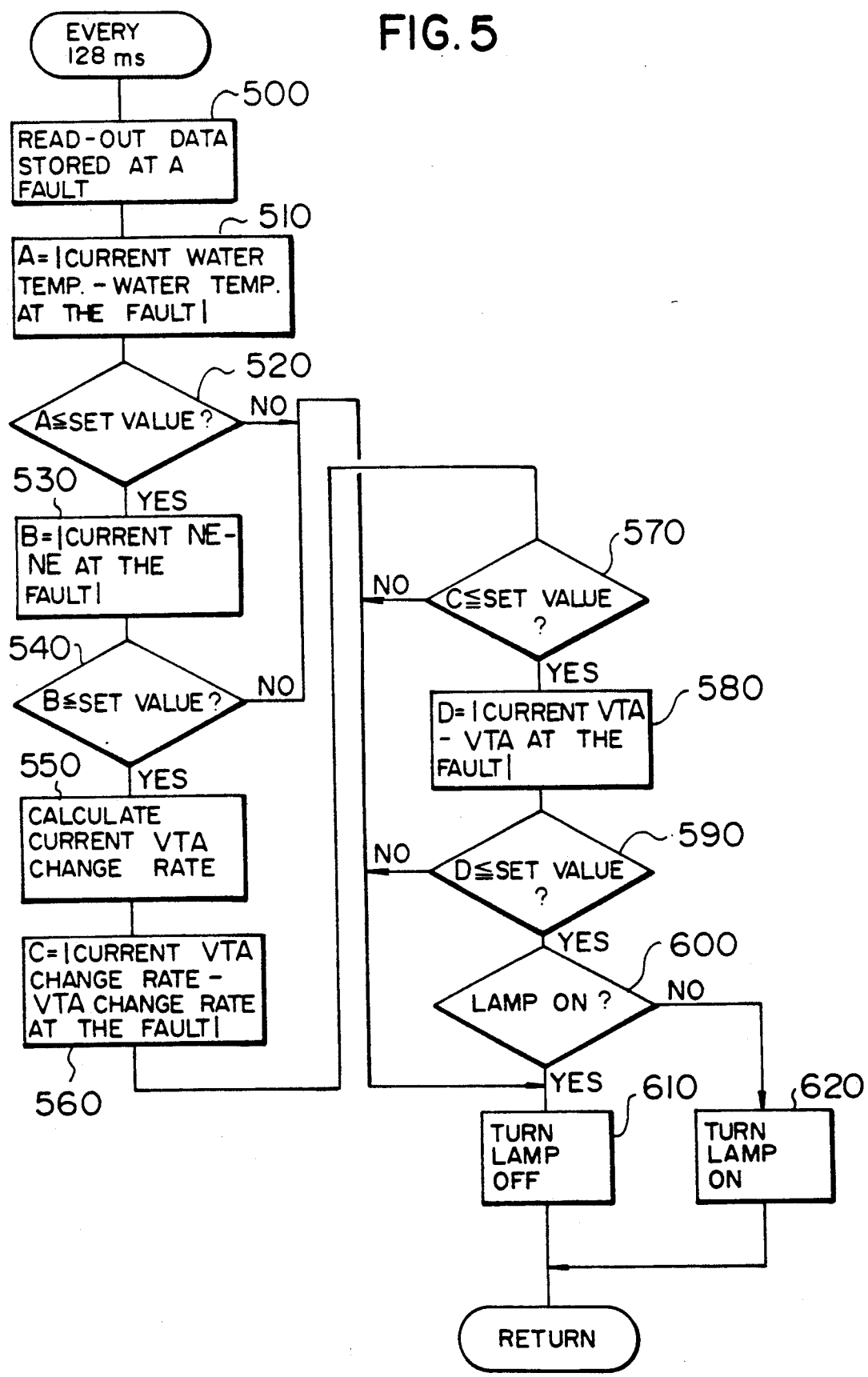
FIG. 5 is a flowchart for explaining the operation of the apparatus of FIG. 1.

FIG. 5 shows a schematic flow of the operation in a reproduction test. To enter the mode of this reproduction test, the switch 15 is turned on for reproduction test entry shown in FIG. 2. By this action, the routine of FIG. 5 is executed by CPU 27 every 128 ms. At the step 500, data at the time of fault occurrence is read out, which includes $NE_n$, $VTA_n$, $VHW_n$, and a change rate of VTA corresponding to the address stored at the step 330 of FIG. 3A. At the step 510, every 128 ms the current water temperature read and an absolute value A of a difference from the water temperature read out at the step 500 is calculated.

At the next step 520, a decision is made whether or not this absolute value A is equal to or less than a set value, and if A is equal to or less than the set value (5° C., for example), as the criterion is met, the process moves on to the step 530. If A is larger than a set value, as the criterion is not met, the process proceeds to the step 610, the lamp 39 is turned off, and control is returned to a calling routine.

At the step 530, a value of the current number of engine revolutions $NE_n$ is read in, and an absolute value B of a difference from the number of engine revolutions at the time of fault which is read out at the step 500 is calculated. At the step 540, a decision is made whether or not this absolute value B is equal to or less than a set value. If B is equal to or less than the set value (200 rpm, for example), as the criterion is fulfilled, the process advance to the step 550. If B is larger than the set value, as the criterion is not met, the process moves on to 610, where the lamp 39 is turned off and control is returned to the calling routine.

At the step 550, the current throttle opening value $VTA_n$ is read in, and the current change rate of VTA is calculated from the value $VTA_{n-1}$ of 128 ms before. At the step 560, an absolute value C of a difference between the current change rate of VTA and the change rate of VTA at the time of fault which is read out at the step 500 is calculated. At the next step 570, a decision is made whether or not this absolute value C is equal to or less than a set value, and if C is equal to or less than the set value 30 degrees/sec, for example), as the criterion is met, the process moves on to the step 580. If C is larger than a set value, as the criterion is not met, the process proceeds to the step 610, where the lamp 39 is turned off and control is returned to the calling routine.

At the step 580, an absolute value D of a difference between the current value $VTA_n$ and the value at the time of fault read out at the step 500 is calculated. At the next step 590, a decision is made whether or not this absolute value D is equal to or less than a set value, and if D is equal to or less than the set value (5°, for example), as the criterion is met, the process moves on to the step 600. If D is larger than the set value, as the criterion is not met, the lamp 39 is turned off, and control is returned to the calling routine.

When the process advances up to the step 600, the current values comply with the stored data of all items during the operation, then if the lamp 39 is lit, the process advances to the step 610 where the lamp 39 is to be turned off. If the lamp is off, the process moves on to the step 620 where the lamp 39 is turned flickering.

Figure 6:
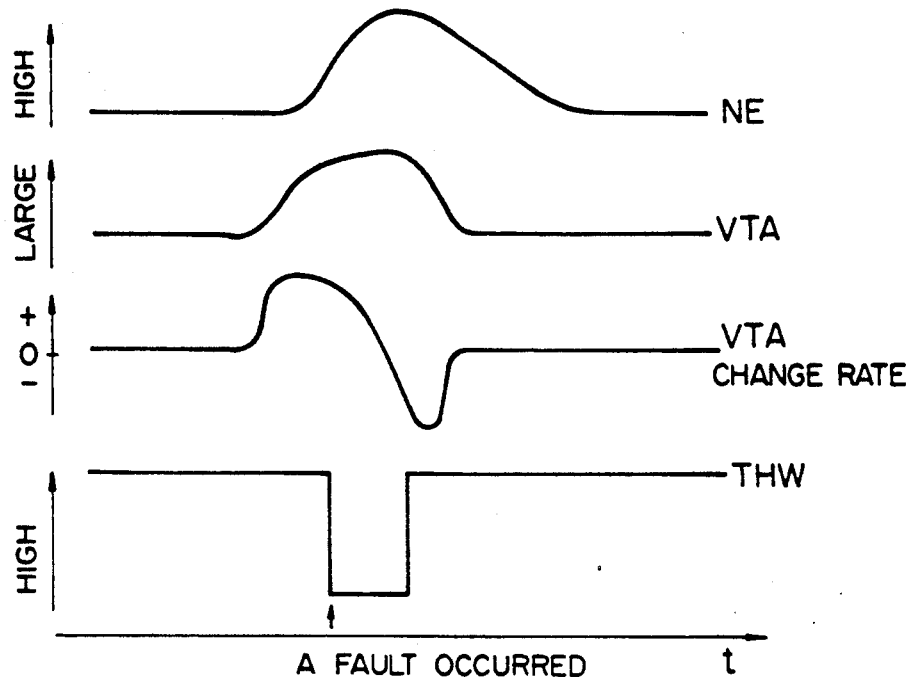
FIG. 6 is a waveform diagram for explaining the operation of the apparatus of FIG. 1.

FIG. 6 shows an example of possible changes in NE, VTA, VTA change rate, and THW caused by a fault. From FIG. 6 no specific abnormality is observed in NE, VTA, and VTA change rate, but the water temperature THW shows a stepped drop despite it should be in high temperature, and it immediately returns to the normal high level. A possible cause is an unexpected opening of circuit in the water temperature sensor or its wire harness or connector. It is not clear why and how such opening of circuit occurs. To investigate the cause, the operating conditions when the fault occurred are reproduced, by turning on the switch 15 for reproduction test entry.

Heretofore, the operating conditions were reproduced, for the most part, according to the feeling of the driver, thus an accurate reproduction was not easy. According to this embodiment of the invention, the presence or absence of intolerable difference between the reproduced conditions and the fault occurring conditions is notified to the driver by off or flicker of the lamp 39, thereby making the reproduction test easy.

Thus, the cause of the fault can be detected, for example, to be such a fact that the water temperature sensor resonates to the vibration produced by a certain number of engine revolutions at a certain load, resulting a circuit in the water temperature sensor being opened.

In another embodiment of this invention, the reproduction of operating conditions is made easier by additionally providing individual devices for each item such as the number of engine revolutions and the opening of the throttle valve to indicate the presence or absence of difference in operating conditions from those at the time of fault occurrence.

Figure 7:
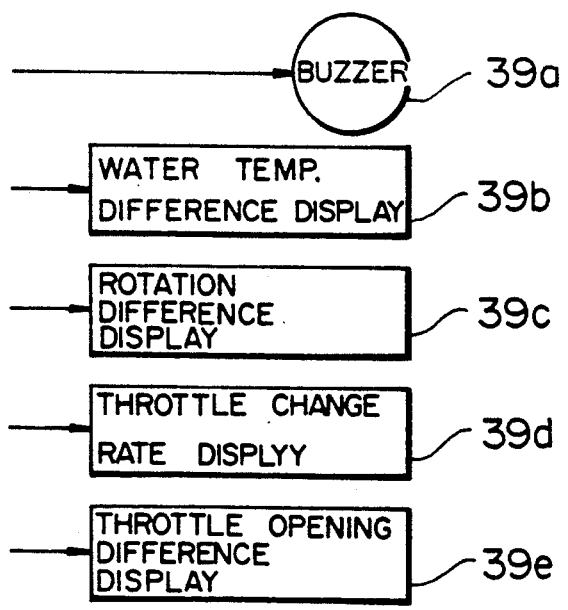
FIG. 7 is a block diagram showing another embodiment of the abnormality warning means of the apparatus of FIG. 1.
Figure 8:
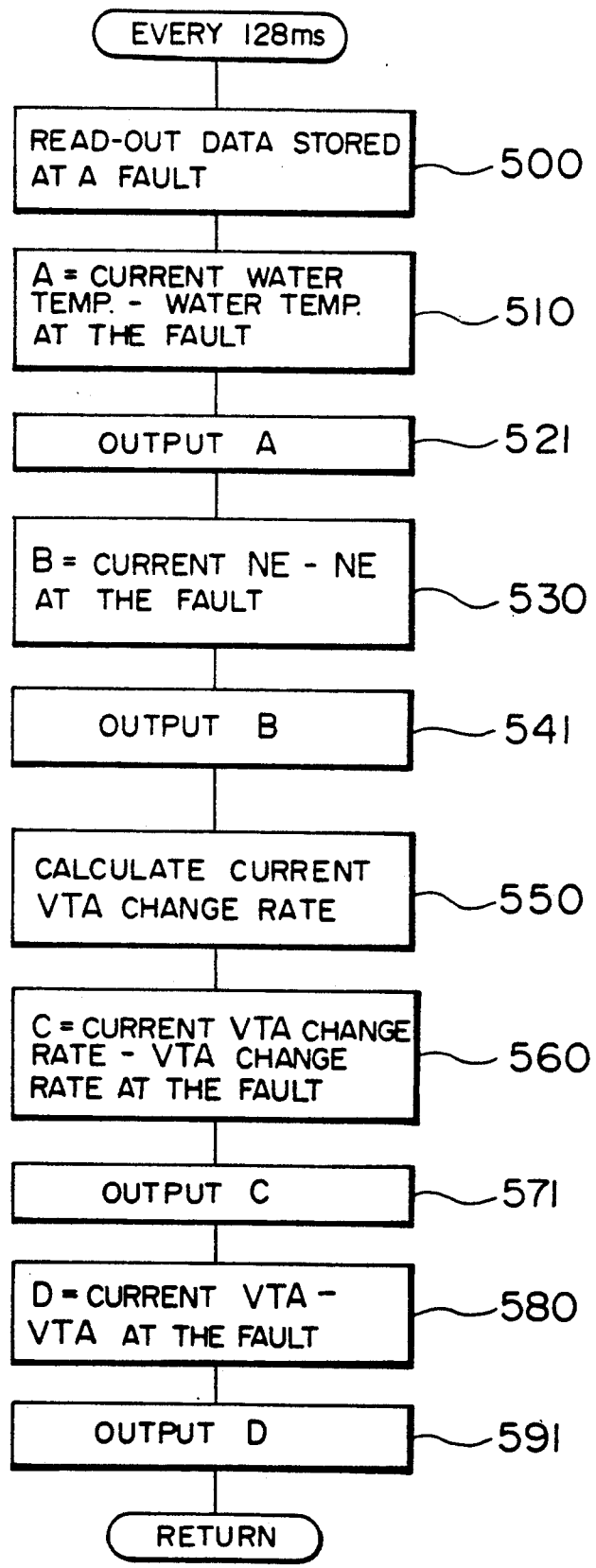
FIG. 8 is a flowchart for explaining the operation when the abnormality warning means of FIG. 7 is used.

And the reproduction is further improved by providing the warning means 39, in addition to a buzzer 39a for alerting the presence of difference, with display devices for each operating item 39b through 39e as illustrated in FIG. 7, for showing the magnitude of difference from the target values of the operating condition, for example, +500 rpm in NE. FIG. 8 shows the flow of the process in the case mentioned above. The process steps of FIG. 8 are similar to those of FIG. 5, except introducing steps 521, 541, 571, and 591 for outputting deviations (relative values) of the respective operating conditions from data at the time of fault through the output terminals of those display devices, instead of the respective steps 520, 540, 570, and 590 for comparing the absolute values of the operating conditions of the different items with preset values in FIG. 5.

Where a manual reproduction is substantially difficult, for example, the change rate of the opening of the throttle valve, a solution is to additionally provide a device for automatically reproducing the operating conditions at the time of fault occurrence from stored data of VTA or from the relation between the VTA change rate and time. This makes it possible to perform a reproduction test automatically to some extent.

As for the problem which fault is to be stored, among conceivable methods are a method to store the first fault, a method to store the latest fault and a method in which faults are given with magnitude levels, and a fault is stored anew only when the fault is in higher level than the stored fault.

With regard to abnormality warning means 39, in the above-mentioned embodiment, the on/off state of the lamp is used to inform the operating conditions, but many other means including a sound generator or a buzzer may be used.

The operating conditions to be stored include NE, VTA, VTA change rate, and THW in the embodiment mentioned above. Any optional items may be selected to store as occasion demands.

Figure 9:
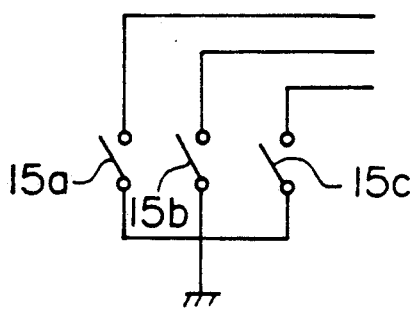
FIG. 9 is an electric circuit diagram showing another embodiment of the switches for entry of reproduction test with the apparatus of FIG. 1.
Figure 10:
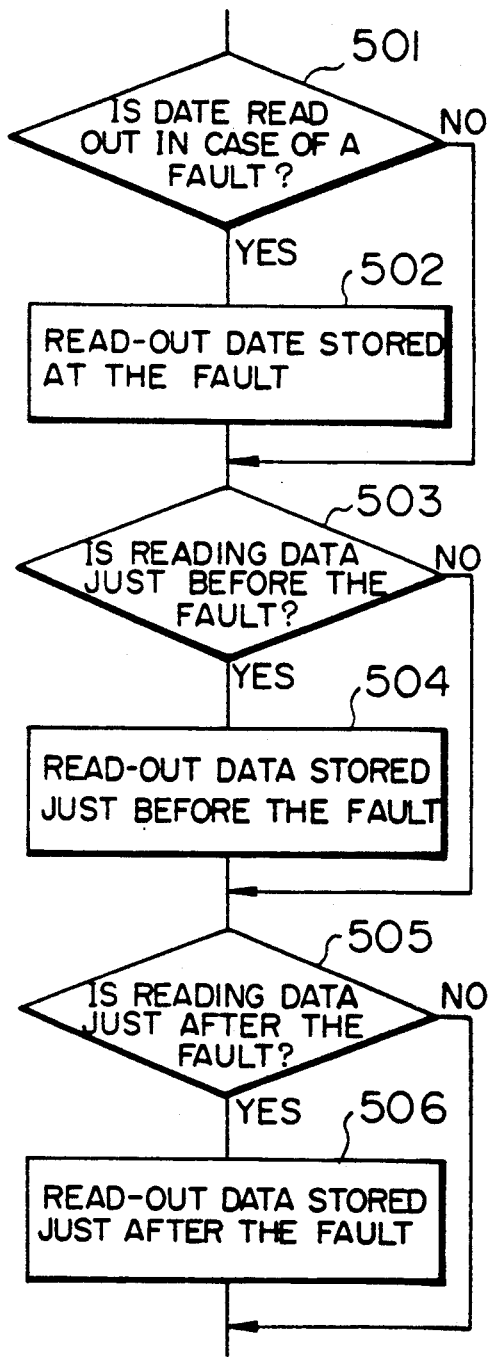
FIG. 10 is a flowchart for explaining the operation when the switches of FIG. 9 are used.
Figure 11:
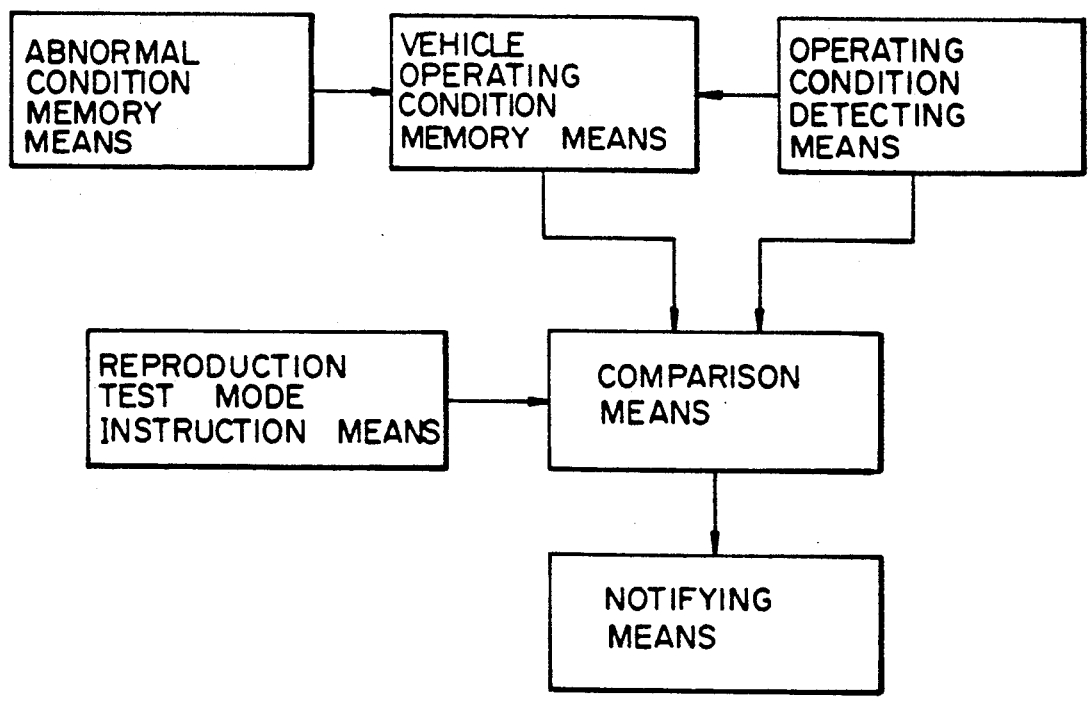
FIG. 11 is a diagram related to claims of this invention.

In the foregoing embodiments, the current vehicle operating conditions of several items are compared with those when abnormality occurred in the vehicle. As shown in FIG. 9, substituting for the single switch 15 for reproduction test entry, switches 15a to 15c for specifying the conditions at the time of, just before and just after the occurrence of abnormality respectively, may be provided so that an abnormal condition reproduction test can be conducted comparing the current vehicle operating conditions with the vehicle operating conditions under those three conditions. FIG. 10 shows the contents of this case in detail corresponding to the step 500 of FIG. 5. At the step 501, a decision is made from the set states of the switches 15a to 15c whether or not data at the time of fault are to be read out. If data at the time of fault are to be read out, the process advances to the step 502 where data at the time of fault are read which has been stored at the address stored at the step 330. If the data at the fault are not required, the process moves on to the step 503. At the step 503, a decision is made from the set states of the switches 15a to 15c whether or not data just before the failure are to be read out. If the data just before the fault are to be read out, the process moves on to the step 504 where the data just before the fault are read out from memories addressed by a specified number under the address stored at the step 330 of FIG. 3. If the data just before the fault are not to be read out, the process proceeds to the step 505. At the step 505, a decision is made from the set states of the switches 15a to 15c whether or not data just after the fault are to be read out. If the data just after the fault are required, the process proceeds to the step 506 where the data just after the fault are read out from memories addressed by a specified number over the address stored at the step 330 of FIG. 3. If the data just after the fault are not required, the process moves on to the step 510 of FIG. 5. By this procedure, one set of data is selected from group of data at the time of fault, data just before the fault and data just after the fault according to the status of the switches 15a to 15c, and the data are compared with data on the current operating conditions.

As is clear from what has been described, according to this invention, when an abnormal condition reproduction test mode is conducted by the reproduction mode instruction means, the current vehicle operating conditions are compared with the vehicle operating conditions when an abnormal condition occurred by the operating condition comparison means, and the results of comparison of vehicle operating conditions are notified to the driver by the notification means. Therefore, anybody, who is not skilled in the technique of reproducing vehicle operating conditions in test, can reproduce the vehicle operating conditions at the time of fault relatively easily. Furthermore, an excellent effect of this invention is that it is easy to confirm whether or not the vehicle operating conditions when abnormality occurred have been really reproduced.

We claim:

1. A fault diagnosis apparatus for mounting on a vehicle, comprising:
   operating condition detecting means for detecting operating conditions of the vehicle;
   abnormal condition memory means for memorizing an occurrence of an abnormal condition of the vehicle;
   vehicle operating condition memory means for storing the operating conditions when the abnormal condition occurs in the vehicle;
   reproduction mode instruction means for instructing to execute an abnormal condition reproduction test mode;
   operating condition comparison means for comparing current vehicle operating conditions in the abnormal condition reproduction mode set by said instruction means with vehicle operating conditions at the time of abnormality occurrence; and
   notifying means for notifying a result of said comparison of vehicle operating conditions.

2. A fault diagnosis apparatus for mounting on a vehicle according to claim 1, wherein said comparison means includes means for activating said notifying means when a difference between the vehicle operating conditions at the time of abnormality occurrence and the current vehicle operating conditions is less than a predetermined value.

3. A fault diagnosis apparatus for mounting on a vehicle according to claim 1, wherein said comparison means includes means for outputting to said notifying means an output corresponding to a difference between the vehicle operating conditions at the time of abnormality occurrence and the current vehicle operating conditions.

4. A fault diagnosis apparatus for mounting on a vehicle according to claim 1, wherein the operating conditions stored by said vehicle operating condition memory means include the number of engine revolutions, the throttle valve opening, the water temperature, and the change rate of the throttle valve opening.

5. A fault diagnosis apparatus for mounting on a vehicle according to claim 1, wherein said vehicle operating condition memory means stores the operating conditions at the time of, before and after the occurrence of an abnormal condition of the vehicle, and wherein said reproduction test mode instruction means includes selection and comparison means for selectively providing said comparison means with the operating conditions at the time of, before and after the occurrence of abnormality as comparison input.

6. A fault diagnosis apparatus for mounting on a vehicle according to claim 5, wherein said comparison means includes means for activating said notifying means when a difference between the vehicle operating conditions at the time of abnormality occurrence and the current vehicle operating conditions is less than a predetermined value.

7. A fault diagnosis apparatus for mounting on a vehicle according to claim 5, wherein said comparison means includes means for outputting to said notifying means an output corresponding to a difference between the vehicle operating conditions at the time of abnormality occurrence and the current vehicle operating conditions.

8. A fault diagnosis apparatus for mounting on a vehicle according to claim 5, wherein the operating conditions stored by said vehicle operating condition memory means include the number of engine revolutions, the throttle valve opening, the water temperature, and the change rate of the throttle valve opening.

* * * * *